United States Patent [19]

Nakahara

[11] Patent Number: 5,502,421
[45] Date of Patent: Mar. 26, 1996

[54] VARIABLE ATTENUATION MICROWAVE ATTENUATOR

[75] Inventor: Kazuhiko Nakahara, Itami, Japan

[73] Assignee: Mitsubishi Denki Kabushiki Kaisha, Tokyo, Japan

[21] Appl. No.: 409,043

[22] Filed: Mar. 23, 1995

[30] Foreign Application Priority Data

Jul. 27, 1994 [JP] Japan .................................. 6-175243

[51] Int. Cl.⁶ .................................................. H03H 7/24
[52] U.S. Cl. ....................... 333/81 R; 333/138; 333/167; 327/308
[58] Field of Search ..................... 333/167, 174, 333/81 R, 81 A, 138, 139; 327/308, 311

[56] References Cited

U.S. PATENT DOCUMENTS

| | | | |
|---|---|---|---|
| 4,378,536 | 3/1983 | Schwarzmann | 333/81 R |
| 5,126,703 | 6/1992 | Kosuga | 333/81 R |

FOREIGN PATENT DOCUMENTS

| | | | |
|---|---|---|---|
| 62-118628 | 5/1987 | Japan . | |
| 239715 | 2/1990 | Japan . | |
| 1734144 | 5/1992 | U.S.S.R. | 333/81 R |

Primary Examiner—Paul Gensler
Attorney, Agent, or Firm—Leydig, Voit & Mayer

[57] ABSTRACT

A variable attenuation microwave attenuator includes input and output terminals, a high-pass filter having an electrical length of 90° and transmitting signals with frequencies higher than a cut-off frequency, a first variable resistor connected between the input terminal and an input end of the high-pass filter, and a second variable resistor connected between an output end of the high-pass filter and the output terminal, wherein input signals applied to the input terminal are attenuated by the first and second variable resistors before and after the high-pass filter. Therefore, the variable attenuator can be a lumped parameter circuit, i.e., the high-pass filter including two inductors and a capacitor, without using a transmission line as in the prior art device, so that the size of the device is significantly reduced. Further, since the resistance values of the first and second variable resistors do not change discretely but change continuously, a lot of different values of attenuation can be obtained with high precision. As a result, the gain (attenuation amount) can be controlled with high precision.

11 Claims, 5 Drawing Sheets

VARIABLE ATTENUATION MICROWAVE ATTENUATOR

FIELD OF THE INVENTION

The present invention relates to a variable attenuation microwave attenuator having a filter function.

BACKGROUND OF THE INVENTION

Figure 11:
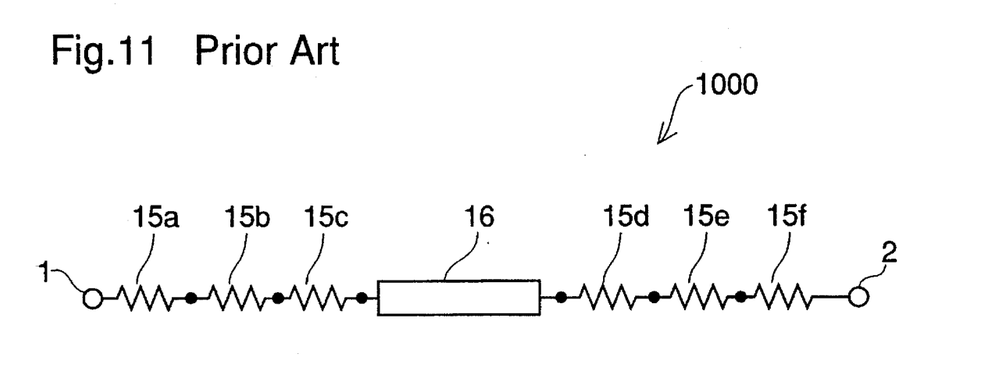
FIG. 11 is an equivalent circuit diagram illustrating a microwave variable attenuator in accordance with the prior art.

FIG. 11 is an equivalent circuit diagram of a microwave variable attenuator used as gain control means in a conventional transmitting and receiving module. In FIG. 11, a microwave variable attenuator 1000 includes a transmission line 16 having a characteristic impedance of 50 Ω and an electrical length of 90°. First to third resistors 15a to 15c each having a prescribed resistance are connected in series between an input terminal 1 and an input end of the transmission line 16. Fourth to sixth resistors 15d to 15f each having a prescribed resistance are connected in series between an output end of the transmission line 16 and an output terminal 2.

A description is given of the operation.

In this microwave variable attenuator 1000, signals input to the input terminal 1 are attenuated while passing through the first to third series resistors 15a to 15c, the transmission line 16, and the fourth to sixth series resistors 15d to 15f and then the signals are output from the output terminal 2. The amount of the attenuation is changed when junctions selected from junctions of the resistors between the input terminal 1 and the transmission line 16 or between the transmission line 16 and the output terminal 2 are connected to each other with a jumper. Therefore, by changing the combination of the two junctions connected with the jumper, the substantial number of the resistors between the input terminal 1 and the transmission line 16 or between the transmission line 16 and the output terminal 2 is changed, whereby the amount of the attenuation is controlled.

Since the electrical length of the transmission line 16 is 90°, a reflected input signal at the input end of the transmission line 16 cancels a reflected signal transmitted through the transmission line 16 and reflected at the output end of that line, so that the circuit is free of apparent reflection. More specifically, the wave that is not reflected at the input end of the transmission line 16 but passes through the transmission line 16 and is reflected at the output end of that line is subjected to a phase shift of just 180° as the reflected wave propagates between the input and output ends of the transmission line 16.

In the above-described microwave variable attenuator according to the prior art, the amount of the attenuation depends on the number of the resistors between the input terminal 1 and the transmission line 16 or between the transmission line 16 and the output terminal 2 which are not short-circuited by a jumper and are effectively used as resistors. Therefore, only discrete values of attenuation corresponding to the number of resistors are obtained, so that a precise control of gain (amount of attenuation) cannot be conducted.

Further, since the transmission line 16 having an electrical length of 90° is used to rid the attenuator of apparent reflection due to the transmission line, the size of the device is large.

Furthermore, since the prior art microwave variable attenuator has relatively wide-band characteristics, in order to eliminate unnecessary signals, a special filter for eliminating the unnecessary signals must be added to the attenuator, resulting in a further increase in the size of the device and an increase in the cost.

SUMMARY OF THE INVENTION

It is an object of the present invention to provide a microwave variable attenuator that provides a larger number of different values of attenuation with higher precision as compared to the prior art device.

It is another object of the present invention to provide a microwave variable attenuator that is smaller in size than the prior art device.

It is still another object of the present invention to provide a microwave variable attenuator that eliminates unnecessary signals without using a filter.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a microwave variable attenuator comprises an input terminal to which input signals are applied, an output terminal from which output signals are output, a high-pass filter having an electrical length of 90° and transmitting signals with frequencies higher than a prescribed frequency, a first variable resistor connected between the input terminal and an input end of the high-pass filter, and a second variable resistor connected between an output end of the high-pass filter and the output terminal, wherein the input signals are attenuated in response to resistance values of the first and second variable resistors at stages before and after the high-pass filter while passing through the resistors to reach the output terminal. Therefore, the microwave variable attenuator can be constituted by only a lumped parameter circuit, i.e., the high-pass filter comprising two inductors and a capacitor, without using a transmission line as in the prior art device, whereby the size of the device is significantly reduced. Further, since the resistance values of the first and second variable resistors do not change discretely but change continuously, a lot of different values of attenuation can be obtained with high precision. As a result, the gain (amount of the attenuation) can be controlled with high precision. Furthermore, since the high-pass filter cuts unnecessary signals in a low frequency band from the input signals, it is not necessary to provide the attenuator with a special filter for eliminating the unnecessary signals. Therefore, the size of the device is significantly reduced compared to a conventional device including a filter for eliminating unnecessary signals.

According to a second aspect of the present invention, in the above-described microwave variable attenuator, the first variable resistor is a first FET including a source, a drain, and a gate wherein the source and the drain are connected in series between the input terminal and the input end of the high-pass filter and a resistance thereof is controlled by a gate bias voltage applied to the gate, and the second variable resistor is a second FET including a source, a drain, and a gate wherein the source and the drain are connected in series between the output end of the high-pass filter and the output terminal and a resistance thereof is controlled by a gate bias voltage applied to the gate. Therefore, the resistance values of the first and second variable resistors are easily set to desired values, and the gain (amount of the attenuation) is easily controlled.

According to a third aspect of the present invention, a microwave variable attenuator comprises an input terminal to which input signals are applied, an output terminal from which output signals are output, a high-pass filter having an electrical length of 90° and input and output ends which are directly connected to the input and output terminals, respectively, which high-pass filter transmits signals with frequencies higher than a prescribed frequency, a third variable resistor connected between a first junction of the input terminal and the input end of the high-pass filter, and ground, and a fourth variable resistor connected between a second junction of the output end of the high-pass filter and the output terminal, and ground, wherein the input signals are attenuated in response to resistance values of the third and fourth variable resistors at stages before and after the high-pass filter while passing through the resistors to reach the output terminal. Therefore, the same effects as described above are achieved.

According to a fourth aspect of the present invention, in the above-described microwave variable attenuator, the third variable resistor comprises a third FET including a source, a drain, and a gate wherein the source and the drain are connected in series between the first junction and ground, and a resistance thereof is controlled by a gate bias voltage applied to the gate, and the fourth variable resistor comprises a fourth FET having a source, a drain, and a gate wherein the source and drain are connected in series between the second junction and ground, and a resistance thereof is controlled by a gate bias voltage applied to the gate. Therefore, the resistance values of the third and fourth variable resistors are easily set to desired values, and the gain (amount of the attenuation) is easily controlled.

According to a fifth aspect of the present invention, in the above-described microwave variable attenuator, the high-pass filter has a characteristic impedance Zf1 that satisfies an equation $Zf1=\sqrt{Z1 \cdot Z2}$ when an impedance at a stage before the filter is Z1 and an impedance at a stage after the filter is Z2. Since the impedance Zf1 of the high-pass filter is set at a value that makes the high-pass filter serve as an impedance conversion circuit, it is not necessary to provide the device with a special impedance conversion circuit. Therefore, the size of the device is significantly reduced compared to a conventional device including an impedance conversion circuit.

According to a sixth aspect of the present invention, a microwave variable attenuator comprises an input terminal to which input signals are applied, an output terminal from which output signals are output, a low-pass filter having an electrical length of 90° and transmitting signals with frequencies lower than a prescribed frequency, a first variable resistor connected between the input terminal and an input end of the low-pass filter, and a second variable resistor connected between an output end of the low-pass filter and the output terminal, wherein the input signals are attenuated in response to resistance values of the first and second variable resistors at stages before and after the low-pass filter while passing through the resistors to reach the output terminal. Therefore, the microwave variable attenuator can be constituted only by a lumped parameter circuit, i.e., the low-pass filter comprising an inductor and two capacitors, without using a transmission line as in the prior art device, whereby the size of the device is significantly reduced. Further, since the resistance values of the first and second variable resistors do not change discretely but change continuously, a lot of different values of attenuation can be obtained with high precision. As a result, the gain (amount of the attenuation) can be controlled with high precision. Furthermore, since the low-pass filter cuts unnecessary signals in a high frequency band which are contained in the input signals, it is not necessary to provide the attenuator with a special filter for eliminating the unnecessary signals. Therefore, the size of the device is significantly reduced compared to a conventional device including a filter for eliminating unnecessary signals.

According to a seventh aspect of the present invention, in the above-described microwave variable attenuator, the first variable resistor comprises a first FET including a source, a drain, and a gate wherein the source and the drain are connected in series between the input terminal and the input end of the low-pass filter, and a resistance thereof is controlled by a gate bias voltage applied to the gate, and the second variable resistor comprises a second FET including a source, a drain, and a gate wherein the source and the drain are connected in series between the output end of the low-pass filter and the output terminal, and a resistance thereof is controlled by a gate bias voltage applied to the gate. Therefore, the resistance values of the first and second variable resistors are easily set to desired values, and the gain (amount of the attenuation) is easily controlled.

According to an eighth aspect of the present invention, a microwave variable attenuator comprises an input terminal to which input signals are applied, an output terminal from which output signals are output, a low-pass filter having an electrical length of 90° and input and output ends which are directly connected to the input and output terminals, respectively, which low-pass filter transmits signals with frequencies lower than a prescribed frequency, a third variable resistor connected between a first junction of the input terminal and the input end of the low-pass filter, and ground, and a fourth variable resistor connected between a second junction of the output end of the low-pass filter and the output terminal, and ground, wherein the input signals are attenuated in response to resistance values of the third and fourth variable resistors at stages before and after the high-pass filter while passing through the resistors to reach the output terminal. Therefore, the same effects as described above are achieved.

According to a ninth aspect of the present invention, in the above-described microwave variable attenuator, the third variable resistor comprises a third FET including a source, a drain, and a gate wherein the source and the drain are connected in series between the first junction and ground, and a resistance thereof is controlled by a gate bias voltage applied to the gate, and the fourth variable resistor comprises a fourth FET including a source, a drain, and a gate wherein the source and drain are connected in series between the second junction and ground, and a resistance thereof is controlled by a gate bias voltage applied to the gate. Therefore, the resistance values of the third and fourth variable resistors are easily set to desired values, and the gain (amount of the attenuation) is easily controlled.

According to a tenth aspect of the present invention, in the above-described microwave variable attenuator, the low-pass filter has a characteristic impedance Zf2 that satisfies an equation $Zf2=\sqrt{Z1 \cdot Z2}$ when an impedance at a stage before the filter is Z1 and an impedance at a stage after the filter is Z2. Since the impedance Zf2 of the low-pass filter is set at a value that makes the low-pass filter serve as an impedance conversion circuit, it is not necessary to provide the device with a special impedance conversion circuit. Therefore, the size of the device is significantly reduced compared to a conventional device including an impedance conversion circuit.

DETAILED DESCRIPTION OF THE PREFERRED EMBODIMENTS

EMBODIMENT 1

Figure 1:
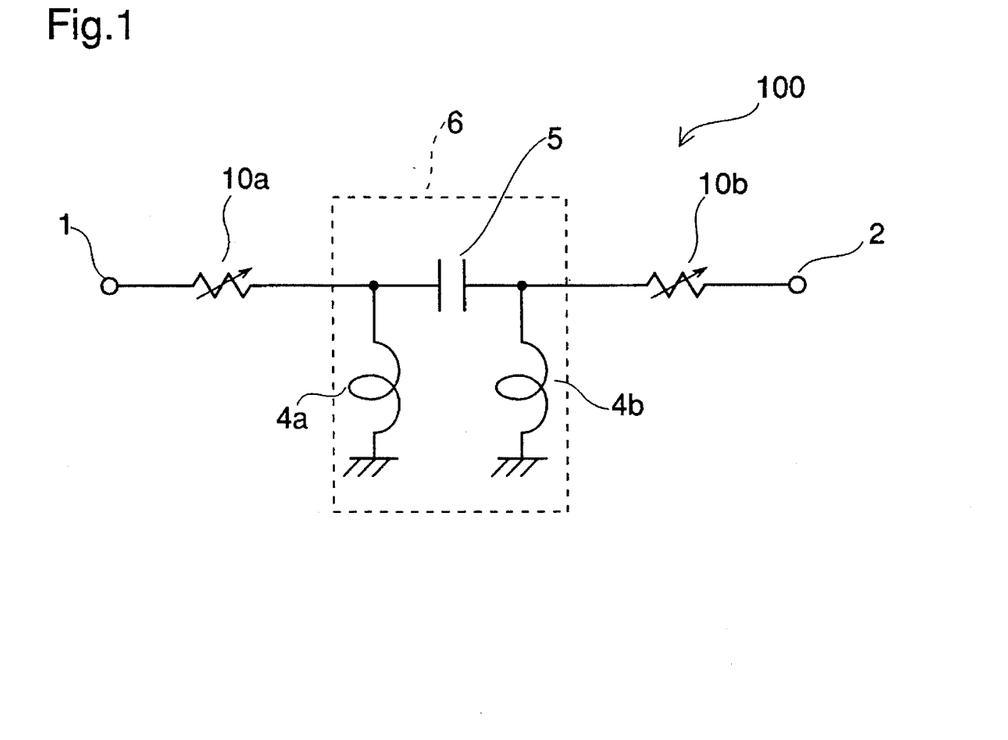
FIG. 1 is an equivalent circuit diagram illustrating a microwave variable attenuator in accordance with a first embodiment of the present invention.

FIG. 1 is an equivalent circuit diagram of a microwave variable attenuator in accordance with a first embodiment of the present invention.

A microwave variable attenuator 100 of this first embodiment comprises a high-pass filter 6 having an electrical length of 90° and first and second variable resistors 10a and 10b. The high-pass filter 6 comprises a capacitor 5 having a prescribed capacitance, an inductor 4a having a prescribed inductance and connected between an input end of the capacitor 5 and ground, and an inductor 4b having a prescribed inductance and connected between an output end of the capacitor 5 and ground. Since the high-pass filter 6 is a lumped parameter circuit comprising the capacitor 5 and the inductors 4a and 4b, it is reduced in size as compared to the transmission line 16 of the prior art attenuator 1000 shown in FIG. 11.

Figure 2:
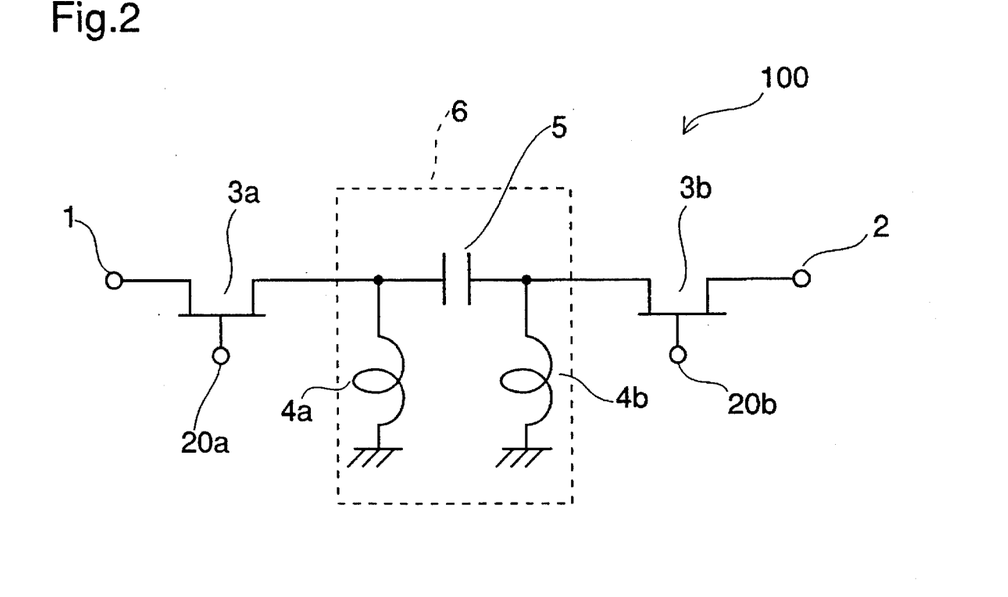
FIG. 2 is an equivalent circuit diagram illustrating the microwave variable attenuator of FIG. 1 in more detail.

FIG. 2 is a circuit diagram illustrating the microwave variable attenuator 100 in more detail. In the figure, the same reference numerals as in FIG. 1 designate the same or corresponding parts. As shown in FIG. 2, the first and second variable resistors 10a and 10b shown in FIG. 1 comprise first and second FETs 3a and 3b, respectively, and gate bias terminals 20a and 20b are connected to gates of the first and second FETs 3a and 3b, respectively. In the first FET 3a serving as a variable resistor, the source and drain thereof are connected in series between the input terminal 1 and the input end of the high-pass filter 6, and the resistance is controlled according to a bias voltage applied to the gate bias terminal 20a. In the second FET 3b serving as a variable resistor, the source and drain thereof are connected in series between the output end of the high-pass filter 6 and the output terminal 2, and the resistance is controlled by a bias voltage applied to the gate bias terminal 20b.

Figure 3:
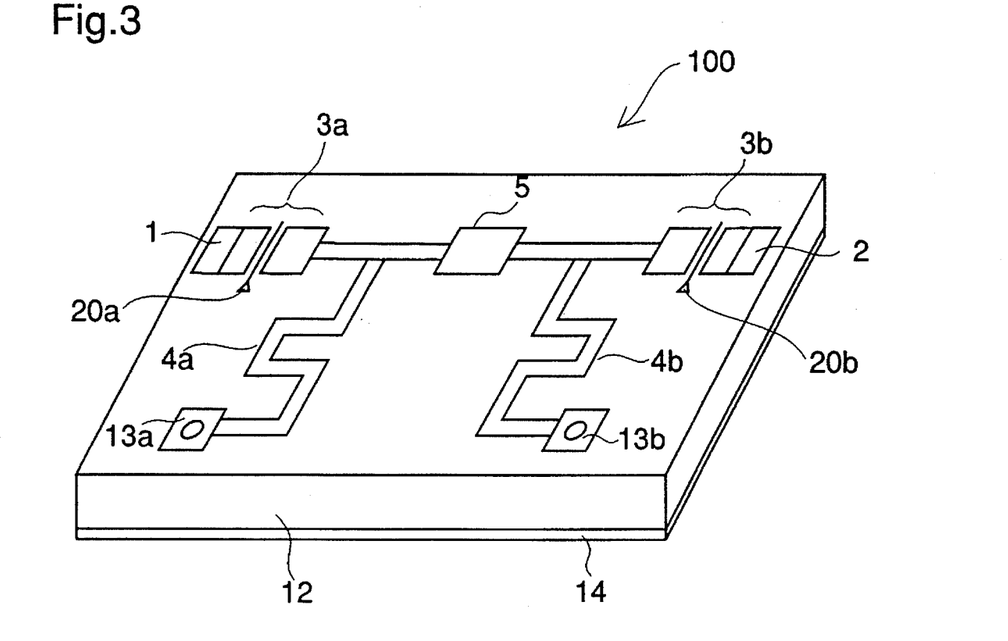
FIG. 3 is a perspective view illustrating a chip structure of the microwave variable attenuator of FIG. 2.

FIG. 3 is a perspective view illustrating a chip structure of the microwave variable attenuator 100, in which the same reference numerals as in FIG. 2 designate the same or corresponding parts. In FIG. 3, reference numeral 12 designates a semiconductor substrate comprising GaAs or the like and having opposite front and rear surfaces. The input and output terminals 1 and 2, the first and second FETs 3a and 3b, and the high-pass filter 6 comprising the capacitor 5 and the inductors 4a and 4b are disposed on the front surface of the substrate 12. A ground conductor 14 is disposed on the rear surface of the substrate 1, and grounding terminals of the inductors 4a and 4b of the high-pass filter 6 are connected to the ground conductor 14 through via-holes 13a and 13b, respectively. The high-pass filter 6 is designed using an ABCD matrix and S parameters. Hereinafter, the design of the high-pass filter 6 will be described.

Initially, the high-pass filter 6 shown in FIG. 1 is represented in an ABCD matrix as follows:

$$\begin{pmatrix} A & B \\ C & D \end{pmatrix} = \begin{pmatrix} 1 & 0 \\ \frac{1}{j\omega L} & 1 \end{pmatrix} \begin{pmatrix} 1 & \frac{1}{j\omega C} \\ 0 & 1 \end{pmatrix} \begin{pmatrix} 1 & 0 \\ \frac{1}{j\omega L} & 1 \end{pmatrix} \quad (1)$$

$$= \begin{pmatrix} 1 - \frac{1}{\omega^2 LC} & \frac{1}{j\omega C} \\ \frac{1}{j\omega L}\left(2 - \frac{1}{\omega^2 LC}\right) & 1 - \frac{1}{\omega^2 LC} \end{pmatrix}$$

where $\omega$ is equal to $2\pi f$.

When this ABCD matrix (1) is converted to S parameters so that the high-pass filter has no reflection of input and output signals. ($S11=S22=0$) and the electrical length of the filter is 90° ($\angle S21=90°$), the following equations (2) to (4) are obtained.

$$S11 = \frac{A + BY0 + CZ0 - D}{A + BY0 + CZ0 + D} = \frac{BY0 - CZ0}{BY0 + CZ0 + 2A} = 0 \quad (2)$$

Therefore,
$$BY0 = CZ0 \quad (3)$$

$$S21 = \frac{2}{A + BY0 + CZ0 + D} = \frac{2}{2A + 2BY0} = \frac{1}{A + BY0} \quad (4)$$

wherein Z0 is the impedance component and Y0 is the admittance component.

Assuming that the circuit has no loss ($|S21|=1$), the equation (4) is reduced to $$S21 = A - BY0 \quad (5)$$

When the equation (5) is combined, the equation (1) is converted to $$S21 = \left(1 - \frac{1}{\omega^2 LC}\right) - \frac{1}{j\omega C} Y0 \quad (6)$$

Since S21 is 90°, $1-(1/\omega^2 LC)$ is 0, and the following equation (7) is obtained.

$$\omega^2 LC = 1 \quad (7)$$

From the equations (3) and (7), an equation of $Y0/j\omega C = Z0/j\omega L$ is obtained, whereby the following equation (8) is obtained.

$$L/C = Z0^2 \text{ (because } Y0 = 1/Z0\text{)} \quad (8)$$

From the equations (7) and (8), the inductance L and the capacitance C of the high-pass filter 6 at the cut-off frequency f of $\omega/2\pi$ are obtained.

Figure 4:
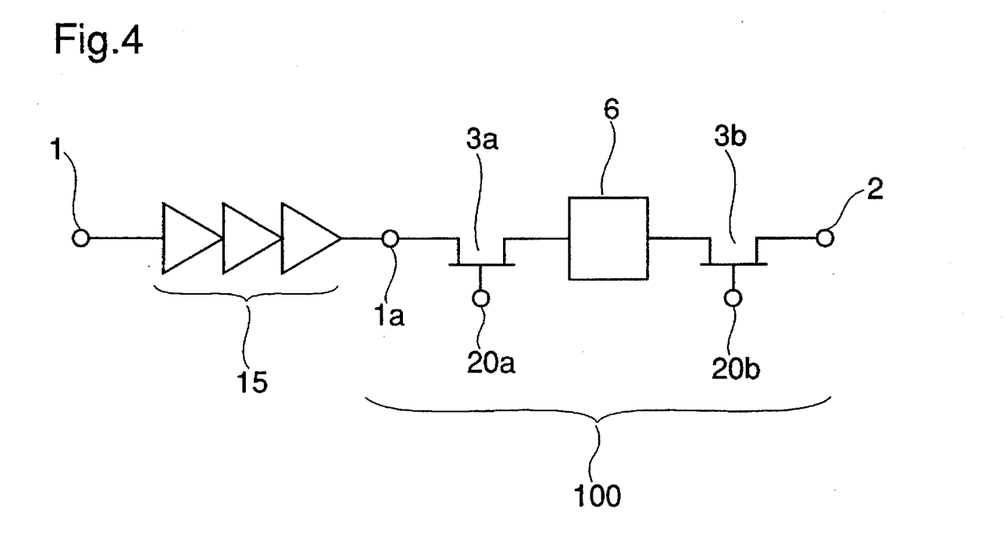
FIG. 4 is an equivalent circuit diagram illustrating a transmitter or a receiver including the microwave variable attenuator of FIG. 2.

FIG. 4 is an equivalent circuit diagram illustrating a transmitter or a receiver including the microwave variable attenuator 100 according to the first embodiment of the present invention. In FIG. 4, the same reference numerals as in FIGS. 1 and 2 designate the same or corresponding parts. Reference numeral 15 designates a high-output amplifier or a low-noise amplifier, and numeral 1a designates an output node of the amplifier 15. More specifically, when the microwave variable attenuator 100 is applied to a transmitter of a transmitting and receiving apparatus, the attenuator 100 is connected after the high-output amplifier 15. On the other hand, when the microwave variable attenuator 100 is applied to a receiver, the attenuator 100 is connected after the low-noise amplifier 15. The attenuator 100 controls the gain of the transmitter or the receiver.

According to the first embodiment of the present invention, in contrast to the prior art attenuator 1000 including the transmission line (distributed constant line) 16 having an electrical length of 90°, the microwave variable attenuator 100 comprises the high-pass filter 6 having an electrical length of 90° and the variable resistors 10a and 10b (FETs 3a and 3b), i.e., the attenuator 100 comprises a lumped parameter circuit. Therefore, the microwave variable attenuator 100 is reduced in size compared to the prior art device.

Further, the gate bias voltage applied to the first and second FETs 3a and 3b serving as the variable resistors 10a and 10b is changed to continuously change the resistance, thereby controlling the amount of the attenuation. Therefore, a lot of different values of the attenuation are obtained with high precision. Consequently, the gain, i.e., the amount of the attenuation, is easily controlled with high precision.

Furthermore, since unwanted low frequency signals are cut off by the high-pass filter 6, it is not necessary to provide the microwave variable attenuator 100 with a special filter for eliminating the unwanted signals. Therefore, the size of the device is significantly reduced compared to a conventional device including a filter for eliminating unwanted signals. In addition, the cost of the device is also reduced.

EMBODIMENT 2

Figure 5:
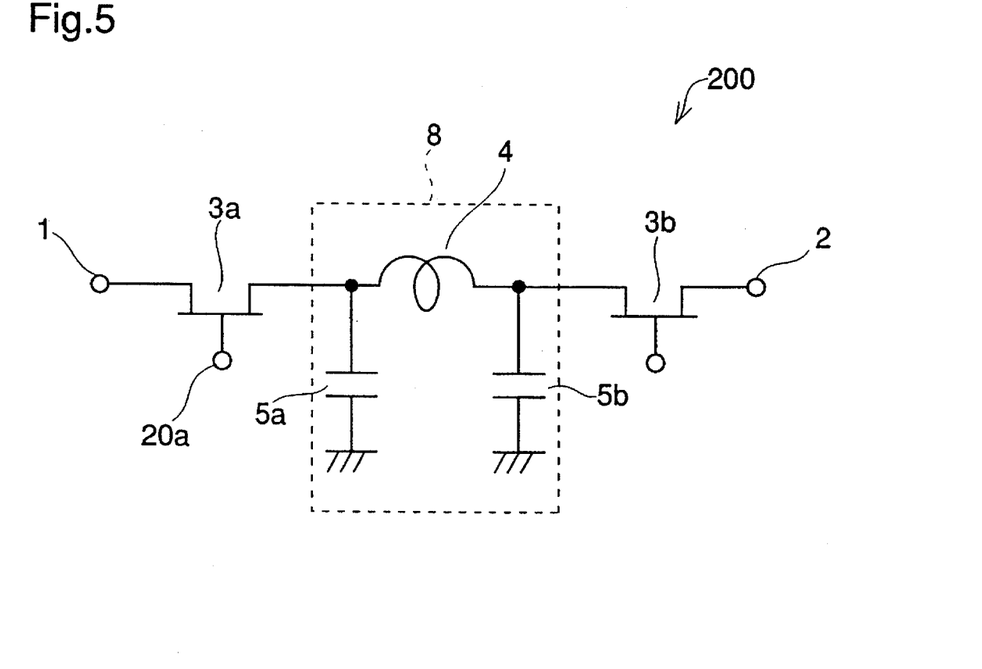
FIG. 5 is an equivalent circuit diagram illustrating a microwave variable attenuator in accordance with a second embodiment of the present invention.

FIG. 5 is an equivalent circuit diagram illustrating a microwave variable attenuator according to a second embodiment of the present invention. In FIG. 5, a microwave variable attenuator 200 includes a low-pass filter 8 having an electrical length of 90°. That is, the structure of the microwave variable attenuator 200 is fundamentally identical to the microwave variable attenuator 100 according to the first embodiment except that the high-pass filter 6 is replaced with the low-pass filter 8. The low-pass filter 8 comprises an inductor 4 having a prescribed inductance, a first capacitor 5a having a prescribed capacitance and connected between an input end of the inductor 4 and ground, and a second capacitor 5b having a prescribed capacitance and connected between an output end of the inductor 4 and ground. Also in this second embodiment of the invention, since the low-pass filter 8 comprises a lumped parameter circuit, the size of the device is reduced.

The low-pass filter 8 is designed in the same process as described with respect to the high-pass filter 6 of the first embodiment using an ABCD matrix and S parameters so that the inductance L and the capacitance C of the whole low-pass filter 8 are equal to the inductance L and the capacitance C of the high-pass filter 6 of the first embodiment.

Figure 6:
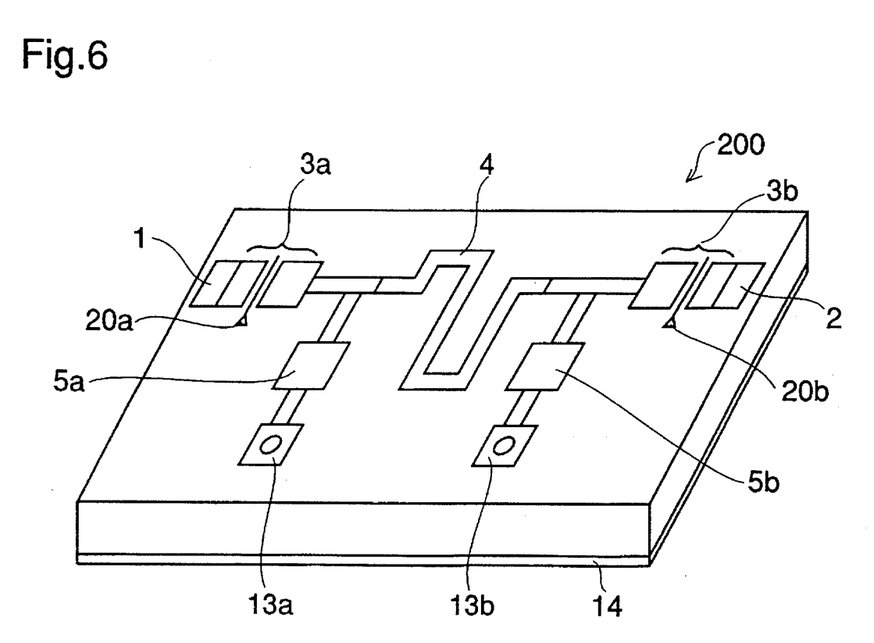
FIG. 6 is a perspective view illustrating a chip structure of the microwave variable attenuator of FIG. 5.

FIG. 6 is a perspective view illustrating a chip structure of the microwave variable attenuator 200. In the figure, the same reference numerals as in FIGS. 3 and 5 designate the same or corresponding parts.

When the microwave variable attenuator 200 is applied to a transmitter or a receiver of a transmitting and receiving apparatus, it is connected after a high-output amplifier or a low-noise amplifier, respectively, and the attenuator 200 controls the gain, i.e., the amount of the attenuation, of the transmitter or the receiver.

According to the second embodiment of the present invention, as in the above-described first embodiment, the microwave variable attenuator 200 is reduced in size compared to the prior art device. In addition, the amount of the attenuation can be easily controlled by varying the gate bias voltage applied to the first and second FETs 3a and 3b, so that the gain, i.e., the amount of the attenuation, is easily controlled with high precision.

Further, since unwanted high frequency signals are cut off by the low-pass filter 8, it is not necessary to provide the attenuator 200 with a special filter for eliminating unwanted signals. Therefore, the size of the device is significantly reduced compared to a conventional device including a filter for eliminating unwanted signals. In addition, the cost of the device is also reduced.

EMBODIMENT 3

Figure 7:
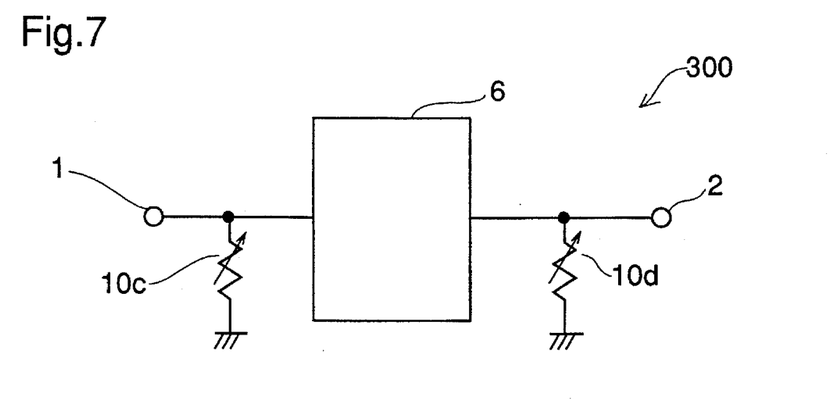
FIG. 7 is an equivalent circuit diagram illustrating a microwave variable attenuator in accordance with a third embodiment of the present invention.

FIG. 7 is an equivalent circuit diagram illustrating a microwave variable attenuator in accordance with a third embodiment of the present invention. In the figure, the same reference numerals as in FIG. 1 designate the same or corresponding parts. A microwave variable attenuator 300 comprises a high-pass filter 6 having an electrical length of 90° and third and fourth variable resistors 10c and 10d.

Figure 8:
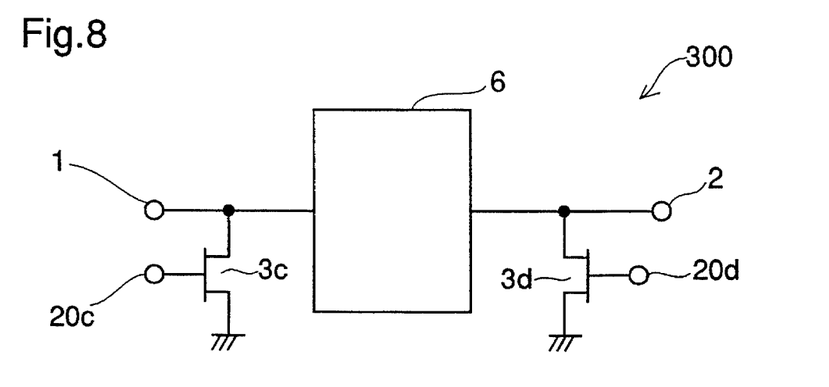
FIG. 8 is an equivalent circuit diagram illustrating the microwave variable attenuator of FIG. 7 in more detail.

FIG. 8 is an equivalent circuit diagram showing the microwave variable attenuator 300 of FIG. 7 in more detail. In FIG. 8, reference numerals 3c and 3d designate third and fourth FETs serving as the third and fourth variable resistors 10c and 10d, respectively, and numerals 20c and 20d designate gate bias terminals connected to gates of the FETs 3c and 3d, respectively. The third FET 3c is connected between the junction of the input terminal 1 and the input end of the high-pass filter 6, and ground. The FET 3c serves as a variable resistor whose resistance is controlled by a bias voltage applied to the gate bias terminal 20c. The fourth FET 3d is connected between the junction of the output end of the high-pass filter 6 and the output terminal 2, and ground. The FET 3d serves as a variable resistor whose resistance is controlled by a bias voltage applied to the gate bias terminal 20d.

In the equivalent circuit of the microwave variable attenuator 300, the resistance of the third FET 3c (variable resistor 10c) is connected in parallel with the impedance of the high-pass filter 6 when the filter is viewed from the input terminal side, and the resistance of the fourth FET 3d (variable resistor 10d) is connected in parallel with the impedance of the high-pass filter 6 when the filter is viewed from the output terminal side. In this circuit structure, the amount of the attenuation of the microwave variable attenuator 300 can be controlled by changing the resistance values of the third and fourth FETs 3c and 3d with the gate bias voltage. Also in this third embodiment, the same effects as described in the first embodiment are achieved.

EMBODIMENT 4

Figure 9:
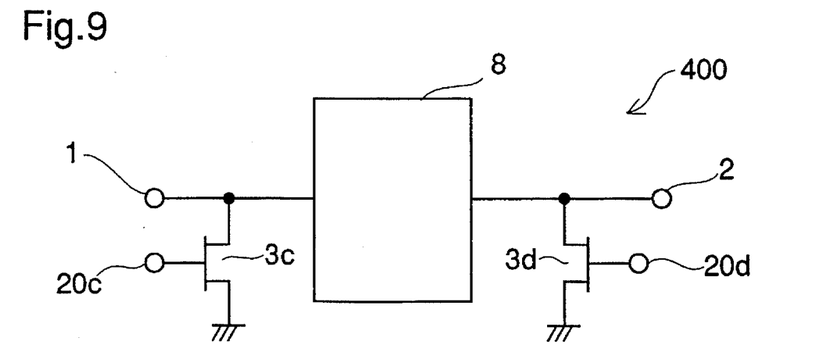
FIG. 9 is an equivalent circuit diagram illustrating a microwave variable attenuator in accordance with a fourth embodiment of the present invention.

FIG. 9 is an equivalent circuit diagram of a microwave variable attenuator in accordance with a fourth embodiment of the present invention. In the figure, the same reference numerals as in FIGS. 5 and 8 designate the same or corresponding parts.

A microwave variable attenuator 400 is fundamentally identical to the microwave variable attenuator 300 according to the third embodiment except that the high-pass filter 6 of the third embodiment is replaced with a low-pass filter 8. The structure of the low-pass filter 8 is the same as that shown in FIG. 5. Also in this fourth embodiment, the same effects as described above are achieved.

EMBODIMENT 5

In the microwave variable attenuators 100 to 400 according to the first to fourth embodiments of the present invention, the characteristic impedance of the high-pass filter 6 or the low-pass filter 8 is an impedance that matches with the impedances at the stages before and behind the filter.

In this fifth embodiment of the present invention, although a high-pass filter having an electrical length of 90° is employed as in the first and third embodiments of the invention, the high-pass filter performs impedance conversion when the impedance before the filter is different from the impedance after the filter.

Figure 10:
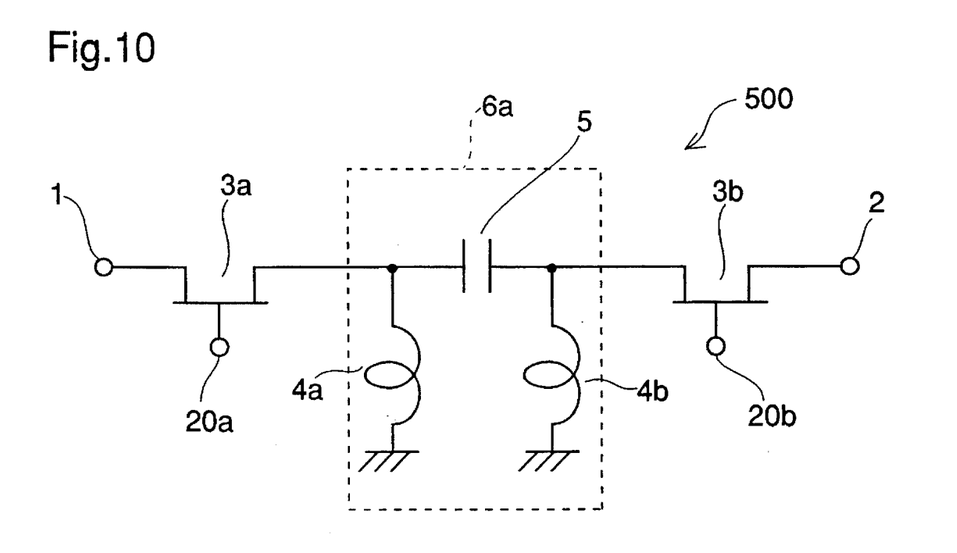
FIG. 10 is an equivalent circuit diagram illustrating a microwave variable attenuator in accordance with a fifth embodiment of the present invention.

FIG. 10 is an equivalent circuit diagram of a microwave variable attenuator in accordance with a fifth embodiment of the present invention. In FIG. 10, the same reference numerals as in FIG. 2 designate the same or corresponding parts. A microwave variable attenuator 500 includes a high-pass filter 6a having an electrical length of 90°.

The microwave variable attenuator 500 is identical to the microwave variable attenuator 100 of the first embodiment except that the characteristic impedance of the high-pass filter 6a is designed so that the high-pass filter 6a has a function of impedance conversion.

A description is given of the design of the high-pass filter 6a.

Since the design of the inductance L and the capacitance C of the high-pass filter 6a is identical to the process described with respect to the first embodiment of the invention, repeated description is not necessary.

Hereinafter, the design of the characteristic impedance of the high-pass filter 6a will be described. The impedance conversion function of the high-pass filter 6a when the impedance at the stage before that filter is Z1 and the impedance at the stage after that filter is Z2 is considered.

Assuming that the characteristic impedance of the high-pass filter 6a is Zf and the impedance of the high-pass filter 6a viewed from the stage before the filter 6a is Z', the following equation (9) is obtained.

$$\frac{Z'}{Zf} = \frac{Z2 + jZf \tan\beta 1}{Zf + jZ2 \tan\beta 1} \quad (9)$$

$$= \frac{Z2/\tan\beta 1 + jZf}{Zf/\tan\beta 1 + jZ2}$$

wherein $\beta$ is the phase constant showing imaginary number of the propagation constant $\gamma$, and 1 is the length of the distributed constant circuit. Since the high-pass filter 6a has no loss, the attenuation constant $\alpha$, a real number, of the propagation constant $\gamma$ is zero.

Since the electrical length of the filter is 90°, $\tan\beta 1 = \tan 90° = \infty$, so that the equation (9) is reduced to $$Z'/Zf = Zf/Z2$$

$$Z' = Zf^2/Z2 \quad (10)$$

Assuming that Z' is equal to Z1, the equation (10) becomes $Zf^2 = Z1Z2$, and the characteristic impedance Zf of the high-pass filter 6a is represented as $$Zf = \sqrt{Z1 \cdot Z2} \quad (11)$$

Therefore, by setting the characteristic impedance Zf of the high-pass filter 6a to a value obtained from equation (11), the high-pass filter 6a is provided with an impedance converting function, converting from Z1 to Z2.

In the microwave variable attenuator according to the fifth embodiment of the invention, in addition to the effects of the above-described first embodiment, since the high-pass filter 6a having an electrical length of 90° serves as an impedance conversion circuit, it is not necessary to provide the attenuator with an impedance conversion circuit when the impedance of the high-pass filter 6a at the stage before the filter is different from the impedance at the stage after the filter. As a result, the size of the device is reduced compared to the conventional device.

In the above-described fifth embodiment of the invention, emphasis has been placed upon a microwave variable attenuator including a high-pass filter having an impedance conversion function, an attenuator with a low-pass filter having a characteristic impedance that satisfies equation (11) is also within the scope of the present invention.

What is claimed is:

1. A variable attenuation microwave attenuator comprising:

an input terminal to which input signals are applied;

an output terminal from which output signals are output;

a high-pass filter having an electrical length of 90° and input and output ends, the high-pass filter transmitting signals with frequencies higher than a cut-off frequency;

a first variable resistor connecting the input terminal to the input end of the high-pass filter; and a second variable resistor connecting the output end of the high-pass filter to the output terminal, wherein input signals are attenuated by the first and second variable resistors and are output from the output terminal.

2. The microwave attenuator of claim 1 wherein the first variable resistor comprises a first field effect transistor (FET) having a source, a drain, and a gate wherein the source and the drain of the first FET are connected between the input terminal and the input end of the high-pass filter and resistance between the source and the drain of the first FET is controlled by a gate bias voltage applied to the gate of the first FET; and the second variable resistor comprises a second FET having a source, a drain, and a gate wherein the source and the drain of the second FET are connected between the output end of the high-pass filter and the output terminal and resistance between the source and the drain of the second FET is controlled by a gate bias voltage applied to the gate of the second FET.

3. The microwave attenuator of claim 1 wherein the high-pass filter has a characteristic impedance Zf1 that satisfies an equation $Zf1 = \sqrt{Z1 \cdot Z2}$ where an impedance at the input terminal, before the filter, is Z1 and an impedance at the output terminal, after the filter, is Z2.

4. A variable attenuation microwave attenuator comprising:

an input terminal to which input signals are applied;

an output terminal from which output signals are output;

a high-pass filter having an electrical length of 90° and input and output ends directly connected to the input and output terminals, respectively, the high-pass filter transmitting signals with frequencies higher than a cut-off frequency;

a first variable resistor connected between a first junction of the input terminal and the input end of the high-pass filter and ground; and a second variable resistor connected between a second junction of the output end of the high-pass filter and the output terminal and ground, wherein input signals are attenuated by the first and second variable resistors and are output from the output terminal.

5. The microwave attenuator of claim 4 wherein the first variable resistor comprises a first field effect transistor (FET) having a source, a drain, and a gate wherein the source and the drain of the first FET are connected between the first junction and ground and resistance between the source and the drain of the first FET is controlled by a gate bias voltage applied to the gate of the first FET; and the second variable resistor comprises a second FET having a source, a drain, and a gate wherein the source and the drain of the second FET are connected between the second junction and ground and resistance between the source and the drain of the second FET is controlled by a gate bias voltage applied to the gate of the second FET.

6. The microwave attenuator of claim 4 wherein the high-pass filter has a characteristic impedance $Zf1$ that satisfies an equation $Zf1=\sqrt{Z1 \cdot Z2}$ where an impedance at the input terminal, before the filter, is $Z1$ and an impedance at the output terminal, after the filter, is $Z2$.

7. A variable attenuation microwave attenuator comprising:

an input terminal to which input signals are applied;

an output terminal from which output signals are output;

a low-pass filter having an electrical length of 90° and input and output ends, the low-pass filter transmitting signals with frequencies lower than a cut-off frequency;

a first variable resistor connecting the input terminal to the input end of the low-pass filter; and a second variable resistor connecting the output end of the low-pass filter to the output terminal, wherein input signals are attenuated by the first and second variable resistors and are output from the output terminal.

8. The microwave attenuator of claim 7 wherein the first variable resistor comprises a first field effect transistor (FET) having a source, a drain, and a gate wherein the source and the drain of the first FET are connected between the input terminal and the input end of the low-pass filter and resistance between the source and the drain of the first FET is controlled by a gate bias voltage applied to the gate of the first FET; and the second variable resistor comprises a second FET having a source, a drain, and a gate wherein the source and the drain of the second FET are connected between the output end of the low-pass filter and the output terminal and resistance between the source and the drain of the second FET is controlled by a gate bias voltage applied to the gate of the second FET.

9. The microwave attenuator of claim 7 wherein the low-pass filter has a characteristic impedance $Zf1$ that satisfies an equation $Zf1=\sqrt{Z1 \cdot Z2}$ where an impedance at the input terminal, before the filter, is $Z1$ and an impedance at the output terminal, after the filter, is $Z2$.

10. A variable attenuation microwave attenuator comprising:

an input terminal to which input signals are applied;

an output terminal from which output signals are output;

a low-pass filter having an electrical length of 90° and input and output ends directly connected to the input and output terminals, respectively, the low-pass filter transmitting signals with frequencies lower than a cut-off frequency;

a first variable resistor connected between a first junction of the input terminal and the input end of the low-pass filter and ground; and a second variable resistor connected between a second junction of the output end of the low-pass filter and the output terminal and ground, wherein input signals are attenuated by the first and second variable resistors and are output from the output terminal wherein the first variable resistor comprises a first field effect transistor (FET) having a source, a drain, and a gate with the source and the drain of the first FET connected between the first junction and ground, and resistance between the source and the drain of the first FET is controlled by a gate bias voltage applied to the gate of the first FET;

the second variable resistor comprises a second FET having a source, a drain, and a gate with the source and the drain of the second FET connected between the second junction and ground, and resistance between the source and the drain of the second FET is controlled by a gate bias voltage applied to the gate of the second FET.

11. The microwave attenuator of claim 10 wherein the low-pass filter has a characteristic impedance $Zf1$ that satisfies an equation $Zf1=\sqrt{Z1 \cdot Z2}$ where an impedance at the input terminal, before the filter, is $Z1$ and an impedance at the output terminal, after the filter, is $Z2$.

* * * * *